(12) United States Patent
Lin

(10) Patent No.: US 7,675,366 B2
(45) Date of Patent: Mar. 9, 2010

(54) INTEGRATED AMPLIFIER CIRCUIT

(75) Inventor: Chih-I Lin, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 12/050,509

(22) Filed: Mar. 18, 2008

(65) Prior Publication Data

US 2009/0237167 A1    Sep. 24, 2009

(51) Int. Cl.
*H03F 3/191* (2006.01)
(52) U.S. Cl. ..................................................... 330/302

(58) Field of Classification Search .................. 330/195, 330/302, 306
See application file for complete search history.

(56) References Cited

U.S. PATENT DOCUMENTS 6,384,688 B1    5/2002    Fujioka et al. ............... 330/302

*Primary Examiner*—Steven J Mottola
(74) *Attorney, Agent, or Firm*—Slater & Matsil, L.L.P.

(57) ABSTRACT

An integrated amplifier circuit includes an input, an output, a transistor with a transistor-input terminal, the transistor-input terminal being coupled to the input, and a transistor-output terminal. The transistor-output terminal is coupled to the output by means of a DC-path. The DC-path includes a first inductive element and a parallel resonant circuit including a second inductive element and a first capacitive element. The first inductive element and the parallel resonant circuit are connected in series between the transistor-output terminal and the output.

24 Claims, 4 Drawing Sheets

US 7,675,366 B2

INTEGRATED AMPLIFIER CIRCUIT

TECHNICAL FIELD

Embodiments according to the invention relate to amplifier circuits. Some embodiments relate to an integrated amplifier circuit for a combination of a DC (Direct Current) supply and a RF (Radio Frequency) signal at an output of the amplifier.

BACKGROUND

Mobile terminals, besides a telephone functionality, accommodate more and more different wireless applications, such as WLAN (Wireless Local Access Network), GPS (Global Positioning System), Bluetooth and possibly mobile television. Low noise amplifiers (LNAs) are often used for each of these applications to improve system sensitivity performance.

Due to an increasing number of antennas it is a big challenge for system designers to place antennas in mobile terminals so as to keep the mobile terminals small and, at the same time, to avoid crosstalk among the different applications. To reduce this crosstalk or coupling between the various applications, a LNA can be placed directly behind a respective antenna to yield a so-called active antenna, such that the impact of the environment and the degradation of performance due to PCB (Printed Circuit Board) line loss can be eliminated. This kind of topology, for example, can often be found in notebooks and flip phones in which the antenna and the LNA are placed behind an LCD (Liquid Crystal Display).

Typically, a LNA does not only comprise input and output terminals for RF signal lines but also two or even three additional terminals for DC power supply and on/off control lines, which are connected to a receiver IC on the main PCB.

SUMMARY OF THE INVENTION

Embodiments according to the invention provide an integrated amplifier circuit comprising an input, an output, a transistor with a transistor-input terminal, the transistor-input terminal being coupled to the input of the integrated amplifier circuit, and a transistor-output terminal, the transistor-output terminal being coupled to the output of the integrated amplifier circuit by means of a DC-path, wherein the DC-path comprises a first inductive element and a parallel resonant circuit, the parallel resonant circuit comprising a second inductive element and a capacitive element, wherein the first inductive element and the parallel resonant circuit are connected in series between the transistor-output terminal and the output of the integrated amplifier circuit.

Further embodiments according to the invention provide a method for providing a DC-supply at an output of an integrated amplifier circuit, the method comprising coupling a transistor-output terminal of a transistor to the output by means of a DC path, wherein the DC path is provided by arranging a first inductive element and a parallel resonant circuit comprising a second inductive element and a first capacitive element in series between the transistor-output terminal and the output.

BRIEF DESCRIPTION OF THE DRAWINGS

Embodiments according to the invention are described in detail with respect to the following drawings, in which.

DETAILED DESCRIPTION OF ILLUSTRATIVE EMBODIMENTS

Figure 1:
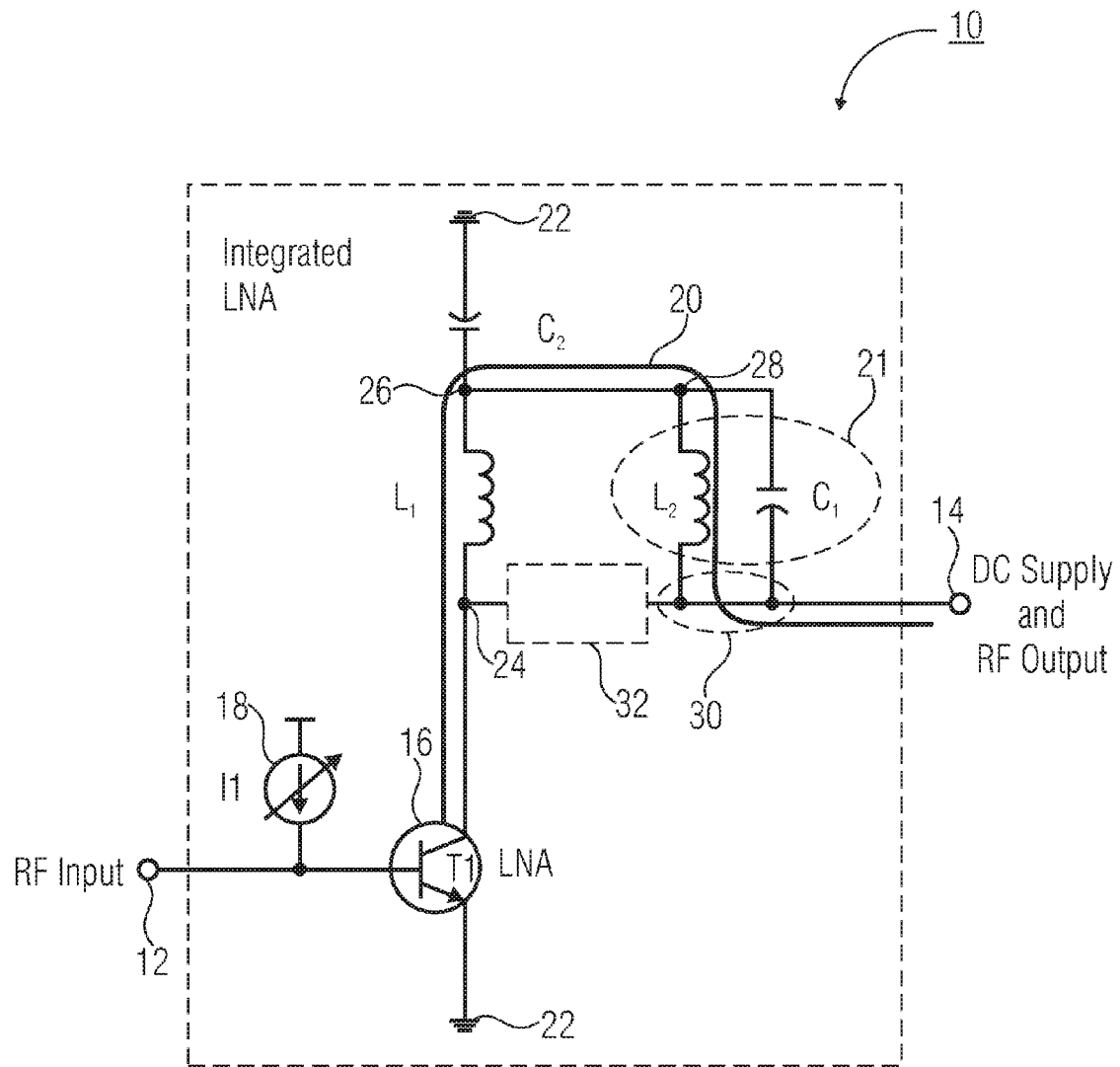
FIG. 1 shows a schematic circuit diagram of an integrated amplifier circuit according to an embodiment of the present invention.

With reference to the following description, it should noted that same functional elements or functional elements having the same effect in various embodiments have same reference numerals. Thus descriptions of these functional elements in the various embodiments described below are mutually interchangeable.

FIG. 1 shows a schematic circuit diagram on integrated amplifier circuit 10 according to an embodiment of the present invention.

The integrated amplifier circuit 10 comprises an input terminal 12 for RF input signals of a predefined frequency $f_{RF}$ or frequency range $f_{RF} \pm \Delta f$ and an output terminal 14 for an RF output signal, which is an amplified version of the RF input signal inputted to the integrated amplifier 10 via the RF input 12. The RF input 12 is coupled to a transistor-input terminal of a transistor 16, which can be a bipolar or field-effect transistor (FET) according to embodiments according to the invention. A transistor-output terminal of the transistor 16 is coupled to the RF output 14 of the integrated amplifier circuit 10 by means of a DC-path 20, wherein the DC-path 20 comprises a first inductive element $L_1$ and a parallel resonant circuit 21 comprising a second inductive element $L_2$ and a capacitive element $C_1$, wherein the first inductive element $L_1$ and the parallel resonant circuit 21 are connected in series between the transistor-output terminal and the output 14.

As it is well-known to those skilled in the art, the transistor 16 can be used in different amplifier topologies. For bipolar transistors the different topologies are common emitter, common base and common collector. For FETs the different topologies are common source, common gate and common drain.

For the common emitter or source configuration, the transistor-input terminal corresponds to the transistor's 16 control terminal, i.e., base or gate terminal, wherein the transistor-output terminal corresponds to the transistor's 16 sink terminal, i.e., the collector or drain terminal. The emitter or source may in this case be coupled to a reference potential 22 which may be a ground potential, as shown in FIG. 1.

For the common base or gate configuration, the transistor-input terminal corresponds to the transistor's 16 source terminal, i.e., emitter or source terminal, wherein the transistor-output terminal corresponds to the transistor's 16 sink terminal, i.e., the collector or drain terminal. The base or gate may in this case be coupled to the reference potential 22.

For the common collector or drain configuration, the transistor-input terminal corresponds to the transistor's 16 control terminal, i.e., base or gate terminal, wherein the transistor-output terminal corresponds to the transistor's 16 source terminal, i.e., the emitter or source terminal. The collector or drain may in this case be coupled to the reference potential 22.

FIG. 1 depicts an embodiment of a common emitter configuration, wherein the RF input signal from the input 12 of the integrated amplifier circuit 10 can modulate a bias current I1 provided to the base terminal of the bipolar transistor 16 by a current source 18. In case of a FET in common source configuration the RF input signal from the input 12 of the integrated amplifier circuit 10 could modulate a bias voltage provided to the gate terminal of the FET by a voltage source.

Although embodiments according to the invention are described referring to a common emitter/source configuration of the transistor 16 in the following, it shall be emphasized that this is only done exemplarily and that embodiments according to the invention are not restricted to amplifiers in common emitter/source configuration.

The first inductive element $L_1$, which may serve as an output-matching component, comprises a first terminal 24 connected to the output or sink terminal of the transistor 16 and a second terminal 26 connected to a first terminal 28 of the parallel resonant circuit 21. A second terminal 30 of the parallel resonant circuit 21 corresponds to the output terminal 14 in embodiments according to the invention.

Some embodiments comprise a second capacitive element $C_2$ connected or circuited between the second terminal 26 of the first inductive element $L_1$ and the reference or ground potential 22. The capacity value of the second capacitive element $C_2$ is dimensioned such that the terminal 26 functions as so-called HF- or RF-ground for RF signals of the predefined frequency $f_{RF}$ or frequency range $f_{RF}\pm\Delta f$ of the integrated amplifier 10. RF-ground means that the signal path from node 26 to ground 22 yields a relatively small impedance for RF signals of the specified frequency $f_{RF}$ (e.g., an impedance smaller than 5 Ohms). In case the integrated amplifier circuit 10 is to be operated for RF signals in the GHz (Giga-Hertz) frequency range, a reasonable capacity value of the second capacitive element $C_2$ may be chosen in the range of some 100 pF (Pico-Farad). For example, the relationship 10 pF$\leq C_2 \leq$1000 pF may hold. In some embodiments, even larger capacity values may be used.

The dotted box 32 between the first terminal 24 of the first inductive element $L_1$ or the sink terminal and the output terminal 14 represents a placeholder for the terminals 24 and 14 operated as an open-circuit, or a placeholder for optional further reactive output-matching components circuited between the first terminal 24 of the first inductive element $L_1$ (or the sink terminal of the transistor 16) and the output 14, as will be described in the following.

Since integrating a traditional RF-choke with a high inductance value at the output 14 into a LNA is impossible or too expensive, embodiments according to the invention provide a concept to replace such an RF-choke with high inductance by the first inductive element $L_1$ and the parallel resonant circuit 21 to enable a RF-choke and DC-supply functionality for the LNA 10 without degrading its RF performance. Choke coils are inductances that isolate AC (Alternating Current) frequency currents from certain areas of a radio circuit. Chokes depend upon the property of self-inductance for their operation. They are used to block alternating current while passing direct current.

Figure 2:
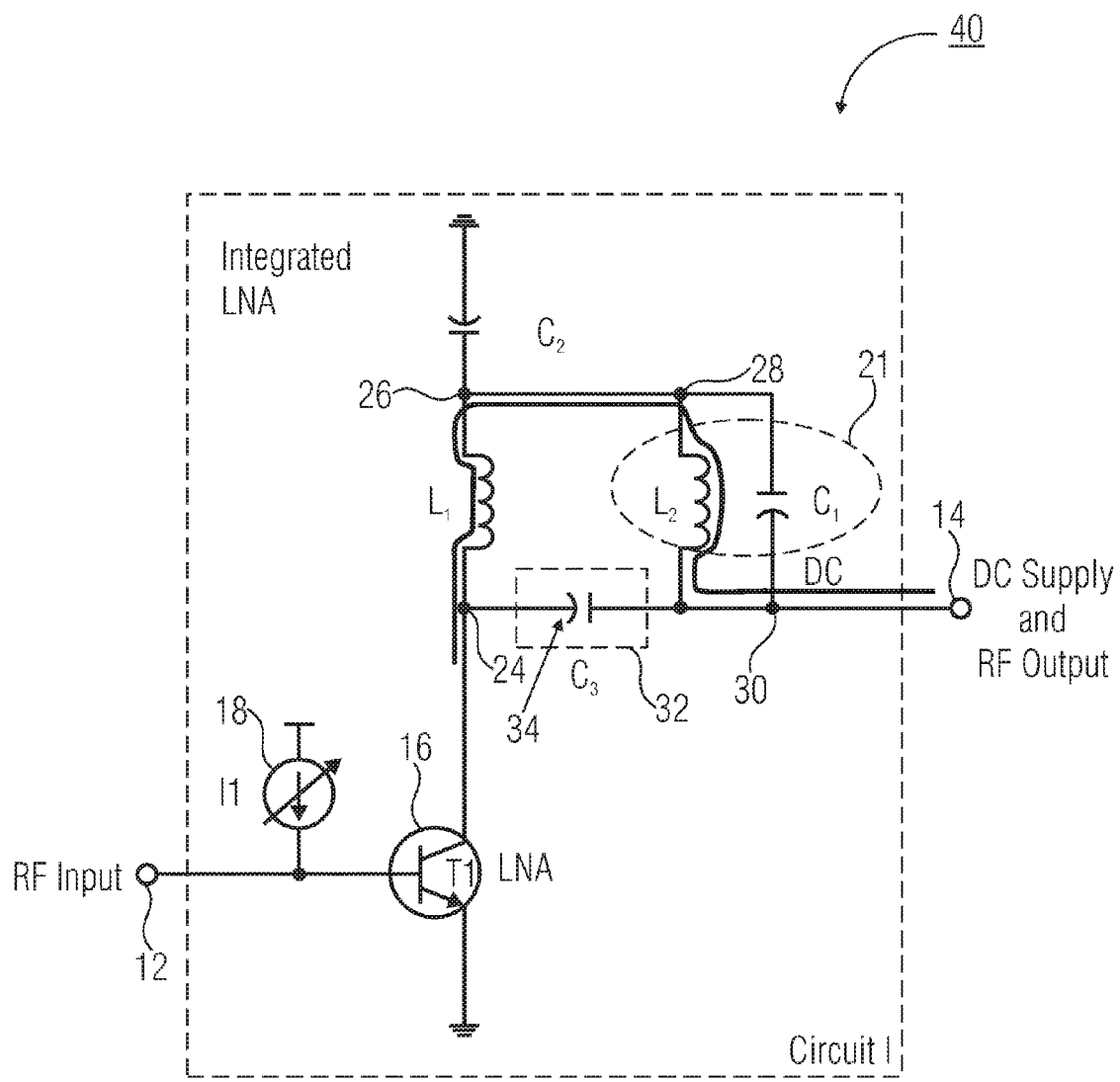
FIG. 2 shows a schematic circuit diagram of an integrated amplifier circuit according to a further embodiment of the present invention.

FIG. 2 shows a circuit diagram for an integrated amplifier circuit 40 according to a further embodiment of the present invention.

In the amplifier circuit 40 shown in FIG. 2, the dotted placeholder box 32 is replaced by a third capacitive element $C_3$ connected between the sink terminal 24 of the transistor 16 and the output terminal 14. The third capacitive element $C_3$ thereby also works as an output-matching component. Hence, in FIG. 2, the first inductive element $L_1$ and the third capacitive element $C_3$ are matching components for the LNA design. Also, the third capacitive element $C_3$ provides a main RF-path between the transistor-output terminal and the output 14 in some embodiments.

The additional integrated on-chip parallel resonant circuit 21 comprising the second inductive element $L_2$ and the first capacitive element $C_1$ has the following functions:

It is well-known that a parallel LC-circuit can be brought into resonance at a given frequency $f_{RF}$. At this given resonance frequency $f_{RF}$ the reactive branch currents through the second inductive element $L_2$ and the first capacitive element $C_1$ are equal and opposite. Hence, they cancel out each other to yield a minimum current in the main line, i.e., the line from node 26 to node 28. Since the total current from node 26 to node 28 is minimum in the case of resonance, the total impedance of the parallel LC-circuit 21 is maximum. Under ideal circumstances, the resonant frequency $f_{RF}$ of the resonant circuit 21 can be computed according to $f_{RF}=1/2\pi\sqrt{L_1 C_2}$. For embodiments according to the invention the resonant frequency $f_{RF}$ of the resonant circuit 21 corresponds to the operating frequency of the LNA 10, 40. In other words, in some embodiments the resonant frequency of the parallel resonant circuit does not differ from an operating frequency of the amplifier by more than 10%.

Through its resonance at the resonant frequency $f_{RF}$, the parallel resonance circuit 21 enables a RF-choke function at the output of the integrated low noise amplifier circuit 40. In other words, it allows a DC-signal, such as a supply voltage or a supply current, to be connected or routed from the output terminal 14 to the output terminal or sink terminal 24 of the transistor 16 via the signal path comprising the first inductive element $L_1$ and the second inductive element $L_2$. At the same time, when being in resonance, the parallel resonant circuit 21 offers a high impedance for RF signals with the given resonance frequency $f_{RF}$. That is, RF signals amplified by the transistor 16 reach the output 14 mainly via the third capacitive element $C_3$. In some embodiments the parallel resonant circuit 21 is configured such than an impedance of the parallel resonant circuit 21 an operating frequency $f_{RF}$ of the integrated amplifier is at least 5 times higher than an impedance of the third capacitive element $C_3$. Further, the parallel resonant circuit 21 offers additional reactive tuning elements ($L_2$, $C_1$) for output matching, which is especially useful for narrowband matching.

Due to the resonance of the parallel LC-circuit 21, the integrated low noise amplifier circuit depicted in FIG. 2 can be suitable for narrowband applications. It will be apparent to those skilled in the art that the nominal values of the inductive and capacitive elements of the integrated amplifier circuit 40 depend on the frequency $f_{RF}$ or frequency range $f_{RF}\pm\Delta f$ of the RF signals to be amplified. For RF signals in the GHz range, the nominal values of the first and second inductive element $L_1$, $L_2$ will be in the about 0.1 nH to about 1000 nH range (nH=Nano-Henry), and the nominal values of the first capacitive element and the third capacitive element $C_1$, $C_3$ will be in the range of 0.1 pF to 1000 pF. Due to the limited values of the reactive elements of the integrated amplifier circuit 40, it is possible to integrate the whole amplifier circuit 40 on a common semiconductor substrate.

Figure 3:
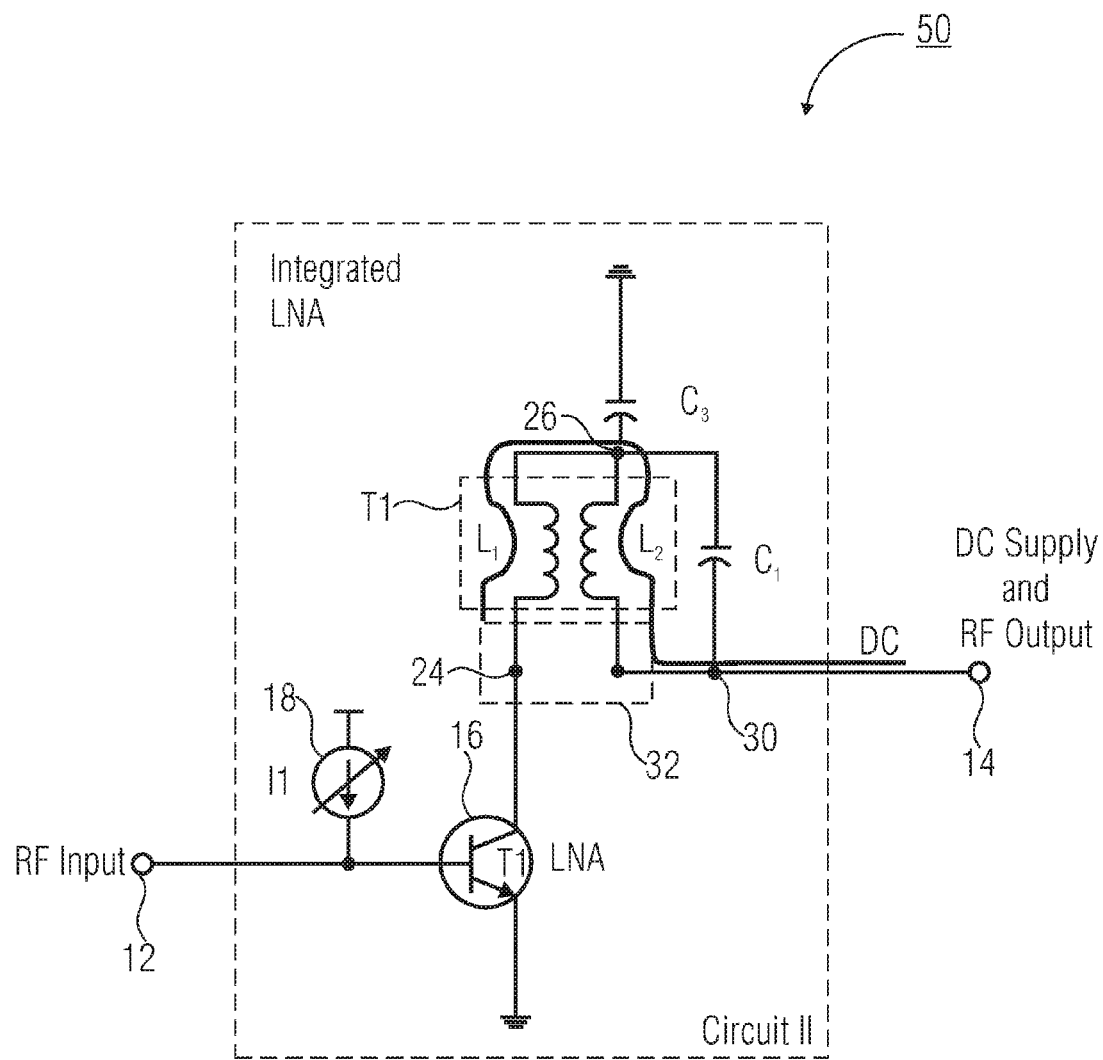
FIG. 3 shows a schematic circuit diagram of an integrated amplifier circuit according to yet a further embodiment of the present invention.

Another concept of an integrated amplifier circuit for combination of DC supply and RF signal line at the output 14 of the amplifier is shown in FIG. 3.

Here, the output terminal or sink terminal 24 of the transistor 16 and the output terminal 14 are not connected by means of a capacitive element such as in the embodiment of FIG. 2. Instead, the first inductive element $L_1$ and the second inductive element $L_2$ are integrated in or on the semiconductor substrate such as to form a transformer T1. The DC-supply connection from the output or sink terminal 24 of the transistor 16 to the output 14 is realized through the node 26 (common RF ground) of the transformer T1, where the first inductive element $L_1$ and the second inductive element $L_2$ are connected to each other. Again, the DC-path from the output or sink terminal 24 of the transistor 16 to the output 14 is realized through the first and second inductive elements $L_1$, $L_2$, as highlighted in FIG. 3. An amplified RF signal present at the first inductive element $L_1$ (e.g., a voltage) is transferred to the output 14 of the integrated amplifier by means of the transformer T1. At the same time, a DC supply signal can be applied from the output 14 to the sink terminal 24 of the transistor 16 via the first and second inductive elements $L_1$, $L_2$.

In this embodiment of the present invention, the transformer T1 and the first capacitive element $C_1$ can be used for output matching. Due to broadband characteristics of the transformer, the amplifier circuit 50 is, for example, applicable for broadband applications. The embodiment shown in FIG. 3 can typically be integrated by using a smaller chip area consumption compared to the embodiment depicted in FIG. 2.

Figure 4:
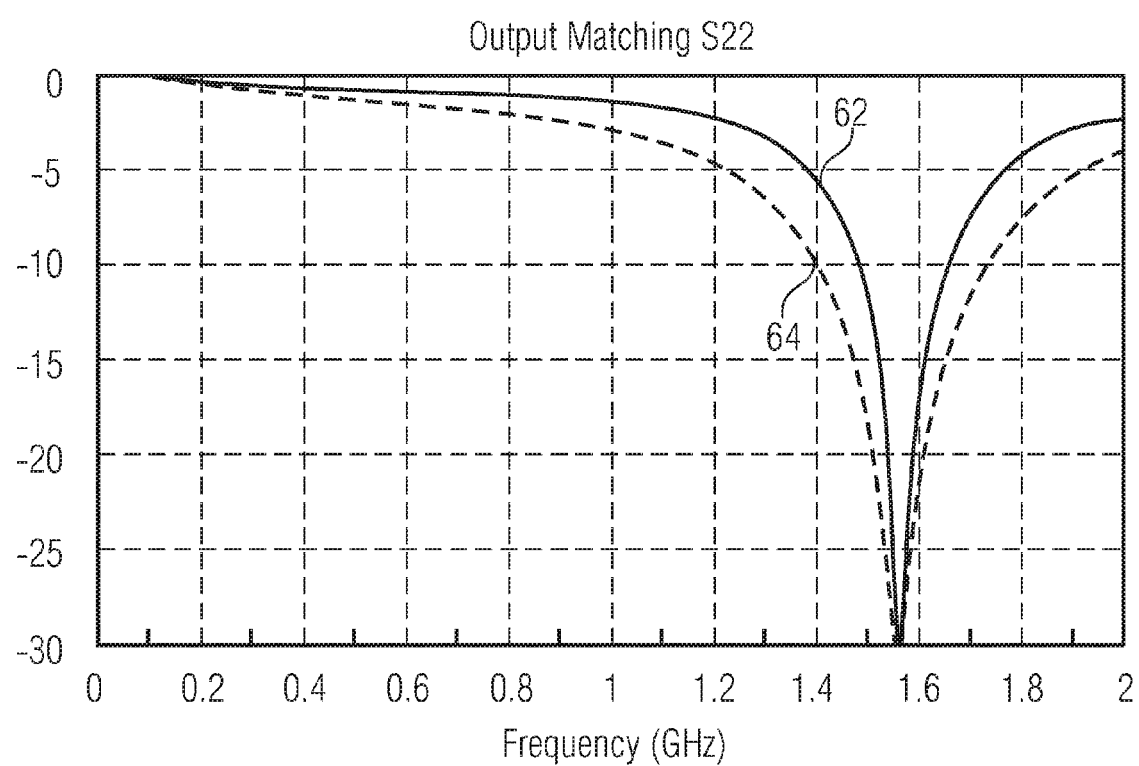
FIG. 4 shows the performance of the output matching for the amplifier circuits according to FIGS. 2 and 3.

FIG. 4 exemplarily shows two output matching performance curves 62, 64 of integrated amplifier circuits according to FIG. 2 and FIG. 3 when applied in GPS (Global Positioning System) applications using a frequency of $f_{RF}$=1575.42 MHz.

Curve 62 represents the reflection coefficient $s_{22}$ versus frequency at output 14 for the integrated amplifier circuit according to FIG. 2, wherein the output terminal 14 combines the DC supply and the RF output for the integrated amplifier circuit 40. Curve 64 represents the reflection coefficient $s_{22}$ versus frequency for the integrated amplifier circuit according to FIG. 3, wherein the output terminal 14 combines the DC supply and the RF output for the integrated amplifier circuit 50. As it can be seen, both integrated amplifier circuits can be well matched at their outputs.

Using embodiments according to the invention no additional external components are required for the combination of the DC supply and the RF signal line at the output 14 of an integrated amplifier. Embodiments according to the invention may, therefore, reduce the pin count required for an LNA and an area required for a PCB. Furthermore, it can simplify the applications for active antennas or for compact modules.

To summarize, embodiments according to the invention provide an on-chip integration of the DC supply line and the RF signal line at the output of an amplifier by coupling a transistor-output terminal of a transistor to the output by means of a DC path, wherein the DC path is provided by arranging a first inductive element and a parallel resonant circuit comprising a second inductive element and a first capacitive element in series between the transistor-output terminal and the output. Embodiments according to the invention can simplify the circuit design and reduce external components and space required for the amplifier.

While this invention has been described in terms of several embodiments, there are alterations, permutations, and equivalents which fall within the scope of this invention. It should also be noted that there a many alternative ways of implementing the integrated amplifier circuits according to embodiments according to the present invention. It is, therefore, intended that the following appended claims be interpreted as including all such alterations, permutations, and equivalents which fall within the true spirit and scope of the present invention.

What is claimed is:

1. An integrated amplifier circuit, comprising:
an input;
an output;
a transistor with a transistor-input terminal, the transistor-input terminal being coupled to the input, and a transistor-output terminal, the transistor-output terminal being coupled to the output via a DC-path, wherein the DC-path comprises a first inductive element and a parallel resonant circuit comprising a second inductive element and a capacitive element, wherein the first inductive element and the parallel resonant circuit are coupled in series between the transistor-output terminal and the output, wherein the DC-path comprises a RF-ground node that is arranged between the first inductive element and the parallel resonant circuit.

2. The integrated amplifier circuit according to claim 1, wherein the first inductive element comprises a first terminal coupled to the transistor-output terminal of the transistor and a second terminal coupled to a first terminal of the parallel resonant circuit, wherein the second terminal of the first inductive element is coupled to a reference potential via a second capacitive element having a capacitance value such that the second terminal of the first inductive element functions as a RF-ground for RF signals of a predefined frequency.

3. The integrated amplifier circuit according to claim 1, wherein a third capacitive element is coupled between the transistor-output terminal of the transistor and the output.

4. The integrated amplifier circuit according to claim 1, wherein the transistor-input terminal is a control terminal of the transistor, and wherein the transistor-output terminal is a sink terminal of the transistor.

5. The integrated amplifier circuit according to claim 4, wherein a source terminal of the transistor is connected to a reference potential.

6. The integrated amplifier circuit according to claim 1, wherein the input is configured to be coupled to a RF input signal, and wherein the output is configured to be coupled to a DC supply signal for the integrated amplifier circuit and to output an amplified version of the RF input signal.

7. The integrated amplifier circuit according to claim 1, wherein the first and second inductive elements are arranged to form a transformer.

8. The integrated amplifier circuit according to claim 1, wherein the transistor, the first inductive element and the parallel resonant circuit are integrated on a common semiconductor substrate.

9. The integrated amplifier circuit according to claim 1, wherein the parallel resonant circuit is configured such that a resonant frequency of the parallel resonant circuit differs from an operating frequency of the integrated amplifier circuit by no more than 10%.

10. The integrated amplifier circuit according to claim 1, wherein the parallel resonant circuit is configured to block a radio-frequency signal of an operating frequency of the integrated amplifier circuit.

11. An integrated amplifier circuit, comprising:
an input;
an output;
a transistor having a transistor-input terminal coupled to the input, and a transistor-output terminal coupled to the output via a DC-path, wherein the DC-path comprises a first inductive element and a parallel resonant circuit comprising a second inductive element and a capacitive element, wherein the first inductive element and the parallel resonant circuit are coupled in series between the transistor-output terminal and the output, wherein the DC-path further comprises a RF-ground node arranged between the first inductive element and the parallel resonant circuit, and wherein the first and second inductive elements are arranged to form a transformer.

12. The integrated amplifier circuit according to claim 11, wherein the first inductive element comprises a first terminal coupled to the transistor-output terminal of the transistor and a second terminal coupled to a first terminal of the parallel resonant circuit, wherein the second terminal of the first inductive element is coupled to a reference potential via a second capacitive element having a capacity value such that the second terminal of the first inductive element functions as the RF-ground node for RF signals of a predefined frequency.

13. An integrated amplifier circuit, comprising:
an input;
an output;
a transistor with a transistor-input terminal coupled to the input, and a transistor-output terminal coupled to the output via a DC-path, wherein the DC-path comprises a first inductive element and a parallel resonant circuit comprising a second inductive element and a first capacitive element, wherein the first inductive element and the parallel resonant circuit are coupled in series between the transistor-output terminal and the output, wherein the DC-path further comprises a RF-ground node arranged between the first inductive element and the parallel resonant circuit, and wherein a second capacitive element is coupled between the transistor-output terminal of the transistor and the output in parallel to the first inductive element and the parallel resonant circuit, wherein the parallel resonant circuit is configured such than an impedance of the parallel resonant circuit at an operating frequency is at least 5 times higher than an impedance of the second capacitive element.

14. The integrated amplifier circuit according to claim 13, wherein the first inductive element comprises a first terminal coupled to the transistor-output terminal of the transistor and a second terminal coupled to a first terminal of the parallel resonant circuit, wherein the second terminal of the first inductive element is coupled to a reference potential via a third capacitive element having a capacity value such that the second terminal of the first inductive element functions as the RF-ground node for RF signals of a predefined frequency.

15. An integrated amplifier circuit, comprising:
means for inputting a RF-signal;
means for amplifying the input RF-signal; and
means for providing a DC-supply for the means for amplifying and for outputting the amplified version of the input RF-signal,
wherein an output of the means for amplifying is coupled to the means for providing the DC-supply and for outputting the amplified version of the input RF-signal by means of a DC path, wherein the DC path is provided by arranging a first inductive element and a parallel resonant circuit comprising a second inductive element and a first capacitive element in series between the output of the means for amplifying and the means for providing the DC-supply and for outputting the amplified version of the input RF-signal.

16. A method for providing a DC-supply at an output of an integrated amplifier circuit, the method comprising:
coupling a transistor-output terminal of a transistor to the output by means of a DC path, wherein the DC path comprises a first inductive element and a parallel resonant circuit in series between the transistor-output terminal and the output, the parallel resonant circuit comprising a second inductive element and a first capacitive element, wherein a RF-ground node is arranged in the DC-path between the first inductive element and the parallel resonant circuit.

17. The method according to claim 16, wherein a transistor-input terminal of the transistor is coupled to an input of the integrated amplifier circuit.

18. The method according to claim 16, wherein a first terminal of the first inductive element is connected to the transistor-output terminal of the transistor and a second terminal of the first inductive element is connected to a first terminal of the parallel resonant circuit, and wherein the second terminal of the first inductive element is coupled to a reference potential via a second capacitive element having a capacity value such that the second terminal of the first inductive element functions as a RF-ground for RF signals of a predefined frequency.

19. The method according to claim 16, wherein a third capacitive element is coupled between the transistor-output terminal of the transistor and the output, in parallel to the first inductive element and the parallel resonant circuit.

20. A method for providing a DC-supply at an output of an integrated amplifier circuit, the method comprising:
coupling a transistor-output terminal of a transistor to the output by means of a DC path, wherein the DC path is provided by arranging a first inductive element and a parallel resonant circuit comprising a second inductive element and a first capacitive element in series between the transistor-output terminal and the output, wherein a third capacitive element is coupled between the transistor-output terminal of the transistor and the output, in parallel to the first inductive element and the parallel resonant circuit.

21. An integrated amplifier circuit, comprising:
an input;
an output;
a transistor with a transistor-input terminal, the transistor-input terminal being coupled to the input, and a transistor-output terminal, the transistor-output terminal being coupled to the output by means of a DC-path, wherein the DC-path comprises a first inductive element and a parallel resonant circuit comprising a second inductive element and a capacitive element, wherein the first inductive element and the parallel resonant circuit are circuited in series between the transistor-output terminal and the output, wherein a third capacitive element is coupled between the transistor-output terminal of the transistor and the output.

22. An integrated amplifier circuit, comprising:
an input;
an output;
a transistor with a transistor-input terminal, the transistor-input terminal being coupled to the input, and a transistor-output terminal, the transistor-output terminal being coupled to the output by means of a DC-path, wherein the DC-path comprises a first inductive element and a parallel resonant circuit comprising a second inductive element and a capacitive element, wherein the first inductive element and the parallel resonant circuit are circuited in series between the transistor-output terminal and the output, wherein the first and second inductive element are arranged to form a transformer.

23. An integrated amplifier circuit, comprising:
an input;
an output;
a transistor with a transistor-input terminal, the transistor-input terminal being coupled to the input, and a transistor-output terminal, the transistor-output terminal being coupled to the output by means of a DC-path, wherein the DC-path comprises a first inductive element and a parallel resonant circuit comprising a second inductive element and a capacitive element, wherein the first inductive element and the parallel resonant circuit are circuited in series between the transistor-output terminal and the output, wherein the transistor, the first inductive element and the parallel resonant circuit are integrated on a common semiconductor substrate.

24. An integrated amplifier circuit, comprising:
an input;
an output;
a transistor with a transistor-input terminal, the transistor-input terminal being coupled to the input, and a transistor-output terminal, the transistor-output terminal being coupled to the output by means of a DC-path, wherein the DC-path comprises a first inductive element and a parallel resonant circuit comprising a second inductive element and a capacitive element, wherein the first inductive element and the parallel resonant circuit are circuited in series between the transistor-output terminal and the output, wherein the parallel resonant circuit is configured to block a radio-frequency signal of an operating frequency of the integrated amplifier circuit.

* * * * *